US005753405A

United States Patent [19]
Elsaesser et al.

[11] Patent Number: 5,753,405
[45] Date of Patent: May 19, 1998

[54] POSITIVE-WORKING RECORDING MATERIAL CONTAINING ALUMINUM BASE AND MAT-FINISHED QUINONE DIAZIDE LAYER DEVELOPABLE IN WEAK ALKALINE DEVELOPERS

[75] Inventors: Andreas Elsaesser, Idstein; Gerhard Buhr, Koenigstein, both of Germany

[73] Assignee: AGFA-Gevaert AG, Leverkusen, Germany

[21] Appl. No.: 674,971

[22] Filed: Jul. 3, 1996

Related U.S. Application Data

[63] Continuation of Ser. No. 374,906, Jan. 19, 1995, abandoned.

[30] Foreign Application Priority Data

Jan. 24, 1994 [DE] Germany ............... 44 01 940.8

[51] Int. Cl.$^6$ .................................................. G03F 7/023
[52] U.S. Cl. ........................ 430/165; 430/191; 430/278.1
[58] Field of Search .............................. 430/165, 191, 430/278.1

[56] References Cited

U.S. PATENT DOCUMENTS

| | | | |
|---|---|---|---|
| 4,871,645 | 10/1989 | Uenishi et al. | 430/192 |
| 4,988,601 | 1/1991 | Ushirogouchi | 430/191 |
| 5,089,373 | 2/1992 | Uenishi et al. | 430/191 |
| 5,215,856 | 6/1993 | Jayaraman | 430/192 |
| 5,225,310 | 7/1993 | Stahlhofen et al. | 430/165 |

FOREIGN PATENT DOCUMENTS

| | | |
|---|---|---|
| 0 096 282 | 12/1983 | European Pat. Off. . |
| 0 301 332 | 2/1989 | European Pat. Off. . |
| 0 384 481 | 8/1990 | European Pat. Off. . |
| 415 266 | 3/1991 | European Pat. Off. . |
| 435 181 | 7/1991 | European Pat. Off. . |
| 0 488 713 | 6/1992 | European Pat. Off. . |
| 0 496 640 | 7/1992 | European Pat. Off. . |
| 0 501 983 | 10/1992 | European Pat. Off. . |
| 0 541 905 | 5/1993 | European Pat. Off. . |
| 0 573 056 | 12/1993 | European Pat. Off. . |
| 3727848 | 3/1989 | German Dem. Rep. . |
| 5083836 | 4/1993 | Japan . |
| 1 561 438 | 2/1980 | United Kingdom . |

*Primary Examiner*—Christopher G. Young
*Attorney, Agent, or Firm*—Foley & Lardner

[57] ABSTRACT

A positive-working recording material is disclosed that has an aluminum base and a mat-finished radiation-sensitive layer that contains a 1,2-naphthoquinone-2-diazide as radiation-sensitive compound and a binder which is insoluble in water but soluble or swellable in aqueous alkali. The radiation-sensitive 1,2-naphthoquinone-2-diazide is an ester of 1,2-naphthoquinone-2-diazide-4- or -5-sulfonic acid and a phenolic compound that contains at least 2, preferably at least 3, phenolic hydroxyl groups, which ester has a phenolic hydroxyl group content of at least 0.5 mmol/g and a diazo unit content of at least 1.5 mmol/g. The binder is a phenol/formaldehyde novolak that contains at least 5 mmol/g phenolic hydroxyl groups, the phenol component of which contains at least 30 mol percent m-cresol and at least 10 mol percent of at least one xylenol and which has a weight-average $M_w$ of 2.000 to 12.000 (determined by means of GPC with polystyrene as standard). The radiation-sensitive layer additionally contains at least one phenolic additive which has a molecular weight $M_w$ of not more than 600 and contains 2 to 4 uncondensed phenyl nuclei and at least 6 mmol/g phenolic hydroxyl groups.

20 Claims, No Drawings

POSITIVE-WORKING RECORDING MATERIAL CONTAINING ALUMINUM BASE AND MAT-FINISHED QUINONE DIAZIDE LAYER DEVELOPABLE IN WEAK ALKALINE DEVELOPERS

This application is a continuation of application Ser. No. 08/374,906, filed Jan. 19, 1995, now abandoned.

BACKGROUND OF THE INVENTION

The present invention relates to a positive-working recording material that has an aluminum base and a radiation-sensitive layer that contains a 1,2-naphthoquinone-2-diazide as radiation-sensitive compound and a novolak as binder. As a result of imagewise irradiation and subsequent development, a positive-working litho offset plate can be produced therefrom.

Recording materials of this basic type are known. DE-A 2 547 905 (=GB-A 1 561 438) discloses a radiation-sensitive recording material that has an aluminum base and a radiation-sensitive layer that contains a 1,2-quinone diazide sulfonic acid ester or amide as photosensitive compound and a novolak as binder. In addition, the layer contains a compound which has an aromatic or aliphatic, preferably phenolic or enolic hydroxyl group, and which is capable of forming chelate complexes. This compound is, in particular, 2,3,4-trihydroxybenzophenone.

Positive-working radiation-sensitive mixtures and recording materials produced therewith are known. EP-A 0 435 181 describes a positive-working photoresist mixture that contains a 1,2-quinone diazide and an alkali-soluble resin obtained by condensing an m-cresol/2-tert-butyl-5-methylphenol mixture with an aldehyde. The mixture may also contain in addition a 1,1,1-tris-hydroxyphenyl-($C_1$–$C_4$)-alkane, and the hydroxyphenyl radicals may furthermore be substituted with ($C_1$–$C_5$)-alkyl or ($C_1$–$C_5$)-alkoxy radicals. A specifically disclosed compound of this type is bis(4-hydroxy-2,5-dimethylphenyl)-(2-hydroxy-phenyl)methane.

The photoresist mixture as claimed in EP-A 0 415 266 differs from that mentioned above solely as a result of the choice of the alkali-soluble binder, which can in this case be obtained by condensing an m-cresol/2,3,5-trimethylphenol mixture with an aldehyde.

A positive-working photosensitive mixture which contains an ester or an amide of a 1,2-naphthoquinone diazide sulfonic or carboxylic acid as photosensitive compound, a water-insoluble phenolic resin which is soluble in aqueous-alkaline solutions as binder, and additionally, a bis(4-hydroxyphenyl) compound which increases the sensitivity is described in DE-A 3 718 416 (=U.S. Pat. No. 5,225,310).

Before the radiation-sensitive layer is applied, the aluminum base material is normally mechanically and/or electrochemically grained, anodically oxidized (anodized) and hydrophilized. The radiation-sensitive layer usually has a weight of less than 3 g per square meter. The recording material is imagewise irradiated through film-type artwork. For this purpose, a vacuum contact copying frame is normally used. The imagewise irradiated material is then developed in an aqueous-alkaline solution. If the litho offset plate is not to be used immediately for printing, it can be provided with a hydrophilic gum.

Standard developers for positive printing plates have an alkali content of 0.8 to 0.9 mol/l. If the development is carried out manually, it generally takes about one minute. At the same time, about 150 ml of developer are needed for one square meter of the irradiated recording material. In the case of automated development using the standard processing speed of 0.8 m/min, the recording material comes into contact with the developer for only about 20 to 30 s. This time interval is only slightly above the minimum development time. Recording material and developer must be well matched to one another in order to ensure a complete development in this short time.

The layer components stripped off during the development bring about a decrease in the alkali content of the developer. This is usually compensated for by adding an equivalent quantity of an alkaline regenerated material. Generally, about 100 ml of developer solution are required per square meter of recording material in the case of automated development. However, the developers hitherto generally used endanger the health of the user as a result of their relatively high alkali content. Disposing of the used developer also presents problems.

It is therefore desired to reduce the alkali content to less than 0.6 mol/l. However, if such weakly alkaline developers are used, markedly longer development times have been necessary. In the case of automated development, the processing speed fell by about half. At the same time, with 200 ml/m$^2$ and over, a markedly larger quantity of developer was also needed even with continuous regeneration.

SUMMARY OF THE INVENTION

It is an object of the present invention to provide a positive-working recording material which can be developed with a weakly alkaline developer (alkali less than 0.6 mol/l) without an increase in development time or in the quantity of developer in proportion to output as compared to known materials.

It is a further object of the invention to provide such a material in which the sensitivity during imagewise irradiation is not reduced, the resistance of the unirradiated areas of the layer to the developer is not decreased and the print run and the baking behavior of the litho offset plates produced therefrom are not adversely affected.

These and other objects according to the invention are achieved by a positive-working recording material comprising:

(A) an aluminum base, and
(B) a mat-finished radiation-sensitive layer on said base that comprises:
 (B1) a radiation-sensitive 1,2-naphthoquinone-2-diazide that is an ester of 1,2-naphthoquinone 2-diazide 4- or 5-sulfonic acid and a phenolic compound that contains at least 2 phenolic hydroxyl groups, which ester has a phenolic hydroxyl group content of at least 0.5 mmol/g and a diazo unit content of at least 1.5 mmol/g,
 (B2) a binder comprising a phenol/formaldehyde novolak which contains at least 5 mmol/g phenolic hydroxyl groups, the phenol component of the binder comprising at least 30 mol percent m-cresol and at least 10 mol percent of at least one xylenol, the binder having a weight-average $M_w$ of 2,000 to 12,000 and being insoluble in water but soluble or swellable in aqueous alkali, and
 (B3) at least one phenolic additive that has a molecular weight $M_w$ of not more than 600 and that contains 2 to 4 uncondensed phenyl nuclei and at least 6 mmol/g phenolic hydroxyl groups.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS

A positive-working recording material according to the invention has an aluminum base and a mat-finished radiation-sensitive layer. The radiation-sensitive layer contains a 1,2-naphthoquinone-2-diazide as radiation-sensitive compound and a binder which is insoluble in water but soluble or swellable in aqueous alkali, wherein

- the radiation-sensitive 1,2-naphthoquinone-2-diazide is an ester of 1,2-naphthoquinone-2-diazide 4- or 5-sulfonic acid and a phenolic compound that contains at least 2, preferably at least 3, phenolic hydroxyl groups, which ester has a phenolic hydroxyl group content of at least 0.5 mmol/g and a diazo unit content of at least 1.5 mmol/g,
- the binder is a phenolic/formaldehyde novolak which contains at least 5 mmol/g phenolic hydroxyl groups and whose phenol component contains at least 30 mol percent of m-cresol and at least 10 mol percent of at least one xylenol and has a weight-average $M_w$ of 2,000 to 12,000 (determined by means of GPC with polystyrene as standard) and
- the radiation-sensitive layer additionally contains at least one phenolic additive which has a molecular weight $M_w$ of not more than 600 and contains 2 to 4 uncondensed phenyl nuclei and at least 6 mmol/g phenolic hydroxyl groups.

The phenolic additive preferably is a compound represented by one of the formulae I to III

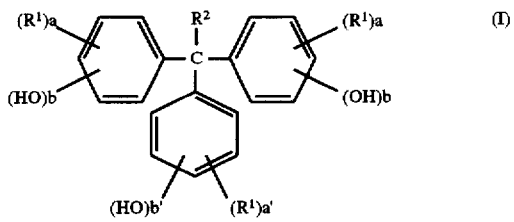

in which $R^1$ is a ($C_1$–$C_4$) alkyl, methoxy or ethoxy group, $R_2$ is a hydrogen atom or a methyl group, a,a' are, independently of one another, 0, 1 or 2, and b,b' are, independently of one another, 1, 2 or 3;

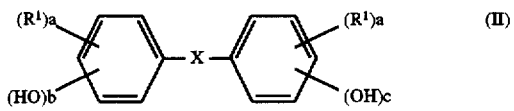

in which

X is a single bond, $SO_2$, S, O or CO, $R^1$, a, b have the meaning specified above, and c is an integer from 0 to 3;

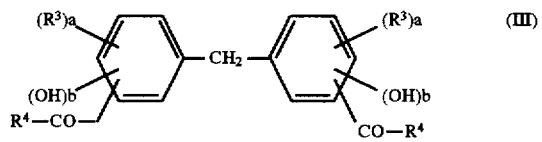

in which $R^3$ is a ($C_1$–$C_4$) alkyl group, $R^4$ is a hydrogen atom, a ($C_1$–$C_4$) alkyl or phenyl group, and a, b have the meaning specified above.

In the compounds of formula I, $R^1$ preferably is a methyl group, a' preferably is 0, and b and b' preferably are 1. Particularly preferred are compounds in which, in addition, $R^2$ is a hydrogen atom and a=2.

Of the compounds of formula III, those are preferred in which $R^4$ is a hydrogen atom or methyl group, a=0 or 1 and b=2 or 3. Particularly preferred are phenolic additives that have a hydroxyl group content of 7 to 19 mmol/g. The phenolic additives, in particular the phenolic compounds of the formulae I to III, bring about in a surprising manner a more rapid and more effective development in the weakly alkaline developers mentioned.

The proportion of the additives is about 1 to 20 percent by weight, preferably 2 to 10 percent by weight, based in each case on the total weight of the nonvolatile components of the radiation-sensitive layer.

The proportion of the novolak binder is 40 to 90 percent by weight, preferably 60 to 85 percent by weight, based in each case on the total weight of the nonvolatile components of the radiation-sensitive layer. The hydroxyl group content of the binder is preferably at least 7.0 mmol/g. The printing plates produced therewith achieve high print runs.

Particularly suitable radiation-sensitive compounds are esters of 1,2-naphthoquinone-2-diazide-4- or -5-sulfonic acid and trihydroxybenzenes or compounds derived therefrom, such as 1,2,3-trihydroxybenzene (=pyrogallol) or 2,3,4-trihydroxyacetophenone (=gallacetophenone). However, not all the hydroxyl groups are esterified in order not to exceed the minimum proportion of free hydroxyl groups specified above. Particularly suitable are esters of 2,3,4,2',3',4'-hexahydroxy-5,5'-dibenzoyl- diphenylmethane or 5,5'-diacetyl-2,3,4,2',3',4'-hexahydroxydiphenylmethane in which, of the 6 hydroxyl groups in each case, 2.5 to 4.5 are on average esterified with 1,2-naphthoquinone-2-diazide-4- or -5-sulfonic acid. Particularly preferred are compounds that have a hydroxyl group content of greater than or equal to 1 mmol/g and a diazo group content of greater than or equal to 2 mmol/g.

The proportion of radiation-sensitive compounds is 5 to 50 percent by weight, preferably 10 to 30 percent by weight, based in each case on the total weight of the nonvolatile components of the radiation-sensitive layer.

In a preferred embodiment, the radiation-sensitive layer also contains an indicator dye. This is preferably a cationic triarylmethane or methine dye. The proportion of the dye is 0.1 to 5 percent by weight, preferably 0.5 to 3 percent by weight, based in each case on the total weight of the nonvolatile components of the radiation-sensitive layer. In addition, the radiation-sensitive layer may also contain further standard additives. These include, in particular, exposure contrast enhancers.

The recording material according to the invention is mat-finished, i.e., it has a rough surface. For this purpose, mat-finishing agents of a particular particle size are generally used. They may be incorporated in the copying layer or applied to the copying layer. Organic and inorganic mat-finishing agents are suitable. The particles used for mat finishing also may have the same composition as the radiation-sensitive layer. The mean height of the peaks on the copying layer is preferably 0.5 to 8 μm. On average, there are 100 to 10,000 of these particles on every square centimeter of the recording layer. More detailed information on a particularly suitable mat finish are to be found in DE-A 4 335 425. The mat finishing ensures that, in the vacuum contact copying frame, the air between film-type artwork and recording material can be pumped out without residue in a short time.

For the purpose of imagewise irradiation, use is made of the radiation sources which are generally standard for the production of litho offset plates and which are known to the person skilled in the art.

During the subsequent development, an aqueous-alkaline developer with a silicate base preferably is used. The ratio of $SiO_2$ to alkali oxide should be at least 1:1. This ensures that the anodized layer of the base material is not attacked during development. Preferred alkali oxides are $Na_2O$ and $K_2O$, and mixtures thereof. In addition to alkali silicates, the developer may contain further components such as buffer substances, complexing agents, antifoaming agents, solvents, corrosion inhibitors, dyes, and, in particular, surfactants and/or hydrotropes. The development preferably is carried out at temperatures from 20° to 30° C. If an automatic developing apparatus is used, the recording materials according to the invention can be developed at a speed of 0.8 m/min and over.

In order to regenerate the developer, alkali silicate solutions that have an alkali content of 0.6 to 2.0 mol/l advantageously are used. They may have the same silicon dioxide/alkali oxide ratio as the developer itself or a different ratio. Generally, however, this ratio is lower than in the developer. The quantity of regenerated material added in each case must be matched to the developing apparatus, the number of plates to be processed per day, the mean proportions of image on said plates and other individual factors. Generally, 1 to 50 ml of regenerated material are added per square meter of recording material. The quantity of regenerated material required may be determined, for example, by conduction measurement.

The examples below serve to explain the subject of the invention. Comparison examples and comparison substances are denoted by *. pbw stands for parts by weight. The following abbreviations used:

D=diazo unit
DA=development-promoting additive
DC=developer consumption
DR=developer resistance
DS=development speed
E=exposure contrast enhancer
I=indicator dye
N=novolak
PGC=phenolic group content
PS=photosensitivity
TAC=total alkali content The following 1,2-quinonediazides were used in the radiation-sensitive layer of the recording material:

D1 ester of 1 mol of 2,3,4-trihydroxy-benzophenone and 1.5 mol of 1,2-naphthoquinone-2-diazide-5-sulfonyl chloride (the ester contained in each case 2.6 mmol/g phenolic hydroxyl groups and diazo units);

D2* ester of 1 mol of 2,3,4-trihydroxy-benzophenone and 3.0 mol of 1,2-naphthoquinone-2-diazide-5-sulfonyl chloride (the ester contained no phenolic hydroxyl groups; 3.24 mmol/g diazo units);

D3 ester of 1 mol of 2,3,4-trihydroxy-benzophenone and 1.1 mol of 1,2-naphthoquinone-2-diazide-4-sulfonyl chloride (3.9 mmol/g phenolic hydroxyl groups, 2.3 mmol/g diazo units);

D4 ester of 1 mol of 5,5'-dibenzoyl-2,3,4,2',3',4'-hexahydroxydiphenylmethane and 3.5 mol of 1,2-naphthoquinone-2-diazide-5-sulfonyl chloride (2.0 mmol/g phenolic hydroxyl groups; 2.7 mmol/g diazo units);

D5 ester of 1 mol of 5,5'-diacetyl-2,3,4,2',3',4'-hexahydroxydiphenylmethane and 4.5 mol of 1,2-naphthoquinone-2-diazide-5-sulfonyl chloride (1.1 mmol/g phenolic hydroxyl groups; 3.2 mmol/g diazo units);

D6 ester of 1 mol of 5,5'-dibenzoyl-2,3,4,2',3',4'-hexahydroxydiphenylmethane and 3.5 mol of 1,2-naphthoquinone-2-diazide-4-sulfonyl chloride (2.0 mmol/g phenolic hydroxyl groups; 2.7 mmol/g diazo units);

D7* ester of 1 mol of 5,5'-dibenzoyl-2,3,4,2',3',4'-hexahydroxydiphenylmethane and 6.0 mol of 1,2-naphthoquinone-2-diazide-5-sulfonyl chloride (the ester contained no phenolic hydroxyl groups; 2.7 mmol/g diazo units).

The following novolaks were used as binders in the radiation-sensitive layer (the mean molecular weight $M_w$ was determined by GPC with polystyrene as standard):

N1 novolak of 30 mol percent 3,5-xylenol and 70 mol percent m-cresol ($M_w$: 3,000; 8.05 mol/g phenolic hydroxyl groups);

N2 novolak of 20 mol percent 2,4-/2,5-xylenol mixture, 40 mol percent m-cresol and 40 mol percent p-cresol ($M_w$: 8,000; 8.15 mmol/g phenolic hydroxyl groups);

N3* novolak of 25 mol percent 4-tert-butylphenol and 75 mol percent phenol ($M_w$: 8,500; 8.33 mmol/g phenolic hydroxyl groups);

N4 novolak of 10 mol percent 3,5-xylenol and 90 mol percent m-cresol ($M_w$: 3,000; 8.24 mmol/g phenolic hydroxyl groups);

N5* novolak of 20 mol percent 2,4-/2,5-xylenol mixture, 40 mol percent m-cresol and 40 mol percent p-cresol ($M_w$: 13,000; 8.15 mmol/g phenolic hydroxyl groups).

The following were used as indicator dyes:

I1 crystal violet (C.I. 42,555)
I2 victoria pure blue (C.I. 44,045)

The following were used as development-promoting additives (PGC=phenolic group content in mmol/g):

DA1 4,4'4"-trihydroxytriphenylmethane (formula I, $R^2$=H; a=a'=0; b=b'=1), PGC: 10.3;

DA2 1,1,1-tris(4-hydroxyphenyl)ethane (formula I, $R^2$=$CH_3$; a=a'=0; b=b'=1), PGC: 9.8;

DA3 4,4',2"-trihydroxy-2,5,2',5'-tetramethyl- triphenylmethane (formula I, $R^2$=H; a=2; a'=0; b=b'=1), PGC: 8.6;

DA4 4,4',4"-trihydroxy-2,5,2',5'-tetramethyl-triphenylmethane (formula I, $R^2$=H; a=2; a'=0; b=b'=1), PGC: 8.6;

DA5 2,3,4,4'-tetrahydroxybenzophenone (formula II, X=CO; a=0; b=3; c=1), PGC: 16.0;

DA6 4,4'-dihydroxydiphenylsulfone (formula II, X=$SO_2$; a=0; b=c=1), PGC: 9.2;

DA7 4,4'-dihydroxy-3,5,3',5'-tetramethyl diphenylsulfone (formula II, X=SO$_2$; R$^1$=CH$_3$; a=2; b=c=1), PGC: 7.3;

DA8 2,4-dihydroxybenzophenone (formula II, X=CO; a=c=0; b=2), PGC: 9.3;

DA9 2,3,4-trihydroxybenzophenone (formula II, X=CO; a=c=0; b=3), PGC: 13.0;

DA10 5,5'-diformyl-2,3,4,2',3',4'-hexahydroxydiphenylmethane (formula III, R$^4$=H; a=0; b=3), PGC: 18.7;

DA11 5,5'-diacetyl-2,3,4,2',3',4'-hexahydroxydiphenylmethane (formula III, R$^4$=CH$_3$; a=0; b=3), PGC: 17.2;

DA12 5,5'-diacetyl-2,4,2',4'-tetrahydroxy-3,3'-dimethyldiphenylmethane (formula III, R$^3$=CH$_3$; R$^4$=H; a=1; b=2), PGC: 11.5;

DA13* 2-hydroxy-5,4'-diphenylbenzophenone (formula II, X=CO, R$^1$=C$_6$H$_5$; a=b=1; c=0), PGC: 2.86.

The following were used as exposure contrast enhancers:

E1 1,2-naphthoquinone-2-diazide-4-sulfonyl chloride;
E2 2-(4-styryl phenyl)-4,6-bistrichloromethyl-s-triazine;
E3 4-dimethylamino-azobenzene.

EXAMPLE 1

A 0.3 mm thick aluminum foil was electrolytically grained in hydrochloric acid (R$_z$ value according to DIN 4768: 5.0 μm), given an intermediate pickling in sulfuric acid, then anodically oxidized in sulfuric acid (oxide weight 4.0 g/m$^2$), hydrophilized with polyvinylphosphonic acid and finally coated with a solution which contained

| | |
|---|---|
| 73.0 percent by weight | N2, |
| 18.0 percent by weight | D in accordance with the tabulation specified above, |
| 2.5 percent by weight | E1, |
| 1.3 percent by weight | I2, |
| 4.0 percent by weight | DA3, |
| 1.0 percent by weight | mat-finishing agent (silicic acid that has a mean particle size of 4 μm), and |
| 0.2 percent by weight | of a surfactant that contains dimethyl-siloxane and ethylene oxide units in butanone/propylene glycol monomethylether (40 pbw/60 pbw). |

The proportion of nonvolatile components in the coating solution was 13 percent by weight. After drying for 1 min at 125° C., the weight of the radiation-sensitive layer was 2.4 g/m$^2$.

The radiation-sensitive recording material produced in this way was then imagewise irradiated in a vacuum contact copier frame through an UGRA offset control wedge with the aid of a 5 kW metal-halide mercury-vapor lamp situated at a distance of 110 cm. It was then developed in an immersion-bath developing apparatus which contained a potassium silicate developer (K$_2$O:Si$_2$O molar ratio=1:1; total alkali content (TAC): 0.4 mol/l). In the comparison examples, development additionally was carried out with a solution which had a total alkali content of 0.9 mol/l (the K$_2$O:SiO$_2$ ratio remained unaltered).

The results are presented in Table 1 below. In the latter PS is photosensitivity; the exposure time necessary for an open step 5 in the UGRA offset control wedge is specified at a processing speed of 0.4 m/min;

DS is development speed; the speed at which the imagewise irradiated recording materials pass through the developing apparatus was increased in steps of 0.1 m/min from 0.4 to 1.4 m/min; the maximum speed (in m/min) at which a complete development was possible is specified;

DC is developer consumption; the developer volume (in ml) which was necessary per square meter of recording material during regeneration was determined. Development time and development speed corresponded to the values specified under PS and DS; the regenerated material had the same K$_2$O:SiO$_2$ ratio as the developer itself, but it had a total alkali content which was twice as high; regeneration was carried out with 10 ml of this solution per square meter of the irradiated recording material that has an image component of 25%; the exhaustion of the developer was detectable from an incomplete development, i.e., a fogging in the non-image areas caused by residues of the layer. The test was terminated and the result regarded as satisfactory if it was possible to develop more than 10 m$^2$ of the recording material completely with 1 l of developer without the occurrence of residual-layer fogging.

TABLE 1

| No. | D | TAC | PS | DS | DC |
|---|---|---|---|---|---|
| 1-1 | D1 | 0.4 | 110 | 1.4 | <100 |
| 1-2* | D2* | 0.4 | 170 | 0.4 | 270 |
| 1-3* | D2* | 0.g | 110 | 1.4 | <100 |
| 1-4 | D3 | 0.4 | 115 | 1.4 | <100 |
| 1-5 | D4 | 0.4 | 110 | 1.4 | <100 |
| 1-6 | D5 | 0.4 | 110 | 1.4 | <100 |
| 1-7 | D6 | 0.4 | 115 | 1.4 | <100 |
| 1-8* | D7* | 0.4 | 185 | 0.4 | 250 |
| 1-9* | D7* | 0.9 | 115 | 1.4 | <100 |

The results show that the recording materials according to the invention have a photosensitivity and development speed as high as known materials, and also do not consume more developer during the development than known materials. In contrast to known materials, they can be developed with a weakly alkaline developer.

Further tests were carried out on the printing plates as in Examples 1-3*, 1-4, 1-5 and 1-9*. The maximum achievable print runs in a sheet-fed offset printing machine was tested first. In this test, an isopropanol content of 20% in the damping water was employed. The baking behavior was then investigated. For this purpose, a commercial baking gum (for example, ®RC 514 of Hoechst AG) was applied to the developed plates and baked in a continuous furnace at 250° C. and a conveyor speed of 0.8 m/min. If an attack on the image areas was evident in the case of a five-minute exposure to N-methylpyrrolidone, the thermal curing was incomplete (−), otherwise the result was denoted by (+).

| Example | Print run | Baking behavior |
|---|---|---|
| 1-3* | 110,000 | + |
| 1-4 | 110,000 | + |
| 1-5 | 110,000 | + |
| 1-9* | 110,000 | + |

The recording materials according to the invention make it possible to produce printing plates that exhibit baking behavior and number of print runs that are as high as those produced with known recording materials.

EXAMPLE 2

A 0.3 mm thick aluminum foil was electrolytically grained in hydrochloric acid (R$_z$ value according to DIN 4768: 3.2 µm), given an intermediate pickling in sulfuric acid, then anodically oxidized in sulfuric acid (oxide weight 2.0 g/m²), hydrophilized with polyvinylphosphonic acid and then coated with a solution that contains

| | |
|---|---|
| 73.0 percent by weight | novolak in accordance with the tabulation specified above, |
| 18.0 percent by weight | D4, |
| 2.5 percent by weight | E1, |
| 1.3 percent by weight | I1, |
| 4.0 percent by weight | DA7, |
| 0.9 percent by weight | mat-finishing agent (silicic acid that has a mean particle size of 4 µm), and |
| 0.1 percent by weight | of a surfactant that has dimethylsiloxane and ethylene oxide units in a mixture of butanone/propylene glycol monomethyl ether (40 pbw/60 pbw). |

The proportion of nonvolatile components in the coating solution was 13 percent by weight. After drying for 1 min at 125° C., the weight of the radiation-sensitive layer was 2.2 g/m².

The recording materials were further processed as described in Example 1. Tests for PS, DS and DC were carried out, in each case as in Example 1.

DR: After development at 0.4 m/min, the litho offset printing form was additionally developed two more times at the same speed and visually investigated for screen and full-tone damage (+=no damage, –=damage in screen and/or full tone, i.e., inadequate resistance to the developer).

TABLE 2

| No. | N | TAC | PS | DS | DC | DR |
|---|---|---|---|---|---|---|
| 2-1 | N1 | 0.4 | 100 | 1.4 | <100 | + |
| 2-2 | N2 | 0.4 | 105 | 1.4 | <100 | + |
| 2-3* | N3* | 0.4 | 80 | 1.4 | <100 | – |
| 2-4 | N4 | 0.4 | 100 | 1.4 | <100 | + |
| 2-5* | N5* | 0.4 | 155 | 1.1 | 170 | + |

EXAMPLE 3

A 0.4 mm thick aluminum foil was electrolytically grained as in Example 1, given an intermediate pickling in sulfuric acid and then anodically oxidized in sulfuric acid, hydrophilized with polyvinylphosphonic acid and then coated with solutions as in Table 3 to which 0.5 percent by weight of mat-finishing agent (silicic acid that has a mean particle size of 3 µm) and 0.2 percent by weight of a surfactant that contains dimethylsiloxane and ethylene/propylene oxide units had been added in each case. The solvent used was again a butanone/propylene glycol monomethyl ether mixture (40 pbw/60 pbw). The proportion of the nonvolatile components in the coating solutions was 13 percent by weight.

TABLE 3

(The data in brackets are % by weight in each case)

| No. | N | D | I | E | DA |
|---|---|---|---|---|---|
| 3-1 | 2 (82) | 3 (13.3) | 1 (1.5) | 2 (0.5) | 9 (2) |
| 3-2 | 2 (82) | 3 (13.3) | 2 (1.5) | 3 (0.5) | 9 (2) |
| 3-3 | 2 (82) | 6 (13.3) | 2 (1.5) | 3 (0.5) | 9 (2) |
| 3-4 | 2 (82) | 6 (13.3) | 1 (1.5) | 2 (0.5) | 9 (2) |

After drying for 1 min at 125° C., the weight of the radiation-sensitive layer was 1.8 g/m².

To investigate developer consumption in the case of reversal processing of the materials, the recording material was contacted by evacuation with a negative test make-up in a vacuum copying frame and irradiated with a 5 kW metal-halide mercury-vapor lamp. Then it was heated to 135° C. in a continuous furnace at a processing speed of 0.8 m/min and, after cooling, burnt out over the entire surface in a post-exposure apparatus which was also built in. Development was then carried out in an immersion-bath developing apparatus using a potassium silicate developer ($K_2O:Si_2O$ molar ratio=1:1) which contained 1 percent by weight of the dipotassium salt of O.O'-bis(carboxymethyl) polyethylene glycol 400 as hydrotrope, 0.05 percent by weight of a nonionic surfactant of the ethoxylated/propoxylated ethylenediamine type (molecular weight 1600, 50% ethylene oxide content) and a TAC of 0.60 mol/l. For the purpose of regeneration, 0.5 mol of KOH were added to one liter of developer. The quantity of regenerated material was 10 ml/qm of litho offset plate that has an image component of 25%.

In Experiments 3-1 to 3-4, no residual layer fogs occurred in the non-image areas up to the end of the consumption test (100 ml of developer/1 m² of recording material).

EXAMPLE 4

A 0.3 mm thick aluminum foil was brushed with a pumice-powder suspension, electrolytically grained in hydrochloric acid ($R_z$ value according to DIN 4768: 6.0 µm), given an intermediate pickling in sulfuric acid, then anodized in sulfuric acid (oxide weight 4.0 g/m²), hydrophilized with polyvinylphosphonic acid and then coated with a solution that contains

| | |
|---|---|
| percent by weight | N1 (as in Table 4), |
| 18.0 percent by weight | D5, |
| 1.0 percent by weight | E1, |
| 0.3 percent by weight | E2, |
| 1.7 percent by weight | I1, |
| percent by weight | DA (as in Table 4) in butanone/propylene glycol monomethyl ether (40 pbw/60 pbw). |

The proportion of the nonvolatile components in the coating solution was 13 percent by weight. After drying for 1 min at 125° C., the weight of the radiation-sensitive layer was 2.4 g/m².

The layer was mat-finished with a 20 percent strength aqueous solution of a terpolymer of vinylsulfonic acid, ethyl acrylate and styrene, which solution was sprayed on electrostatically such that the mean height of the peaks was 4 µm.

The recording materials were exposed as in Example 1, and developed in a spray developing apparatus using a potassium silicate developer ($K_2O:Si_2O=1:1.3$) which contained 0.005 percent by weight of a cationic surfactant of the quaternary ethoxylated/propoxylated ammonium surfactant type and a TAC of 0.45 mol/l.

An exhaustion test with regeneration was carried out with the exposure time found and at a development speed of 0.8 m/min. For the purpose of regeneration, 0.5 mol of KOH were added to one liter of developer. The quantity of regenerated material was 20 ml/qm of litho offset plate with an image component of 25%. The end point of the test was manifested in the form of an incomplete development, i.e., a fog in the non-image areas caused by residues of the layer.

TABLE 4

| Example | N1 Percent by weight | DA | PS percent by weight of DA | DS | DC |
|---|---|---|---|---|---|
| 4-1* | 79 | — | — | 160 | 1.1 | 140 |
| 4-2 | 75 | 1 | 4 | 110 | 1.4 | <100 |
| 4-3 | 75 | 2 | 4 | 110 | 1.4 | <100 |
| 4-4 | 75 | 3 | 4 | 110 | 1.4 | <100 |
| 4-5 | 75 | 4 | 4 | 110 | 1.4 | <100 |
| 4-6 | 76 | 5 | 3 | 110 | 1.4 | <100 |
| 4-7 | 75 | 6 | 4 | 110 | 1.4 | <100 |
| 4-8 | 74 | 7 | 5 | 110 | 1.4 | <100 |
| 4-9 | 75 | 8 | 4 | 110 | 1.4 | <100 |
| 4-10 | 75 | 9 | 4 | 110 | 1.4 | <100 |
| 4-11 | 76 | 10 | 3 | 110 | 1.4 | <100 |
| 4-12 | 75 | 11 | 4 | 110 | 1.4 | <100 |
| 4-13 | 74 | 12 | 4 | 110 | 1.4 | <100 |
| 4-14* | 73 | 13* | 6 | 150 | 1.1 | 130 |

The results show that recording materials according to the invention have a photosensitivity and development speed that are as high as known materials, and have just as beneficial consumption values as known materials (Examples 1-3*, 1-9*). In contrast to known materials they can be developed with a weakly alkaline developer.

What is claimed is:

1. A positive-working recording material for the manufacture of printing plates comprising:
   (A) an aluminum base, and
   (B) a mat-finished radiation-sensitive layer on said base wherein the mat-finished layer has peaks that have a mean height of from about 0.5 to 8.0 μm and wherein there are 100 to 10,000 matting particles per cm² of the layer, that comprises, in admixture:
   (B1) a radiation-sensitive 1,2-naphthoquinone-2-diazide that is an ester of 1,2-naphthoquinone 2-diazide 4- or 5-sulfonic acid and a phenolic compound that contains at least 2 phenolic hydroxyl groups, which ester has a phenolic hydroxyl group content of at least about 0.5 mmol/g and a diazo unit content of at least about 1.5 mmol/g,
   (B2) a binder comprising a phenol/formaldehyde novolak which contains at least about 5 mmol/g phenolic hydroxyl groups, the phenol component of the binder comprising at least about 30 mol percent m-cresol and at least about 10 mol percent of at least one xylenol, the binder having a weight-average $M_w$ of about 2,000 to 12,000 and being insoluble in water but soluble or swellable in aqueous alkali, and
   (B3) at least one phenolic additive that has a molecular weight $M_w$ of not more than about 600 and that contains 2 to 4 uncondensed phenyl nuclei and at least about 6 mmol/g phenolic hydroxyl groups, wherein components (B1), (B2) and (B3) are present in amounts sufficient to form a uniform layer that can be developed in an automatic developing apparatus at a speed of at least 0.8 m/min with a weakly alkaline developer that contains less than 0.6 mol alkali per liter, wherein the phenolic additive is a compound represented by one of the formulae I to III:

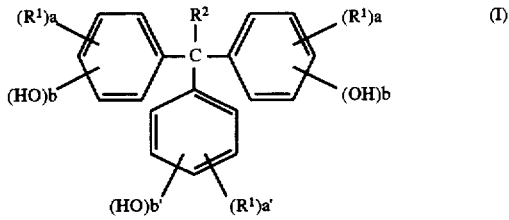

in which
R¹ is a ($C_1$-$C_4$) alkyl, methoxy or ethoxy group,
R₂ is a hydrogen atom or a methyl group,
a,a' are, independently of one another, 0, 1 or 2, and
b,b' are, independently of one another, 1, 2 or 3;

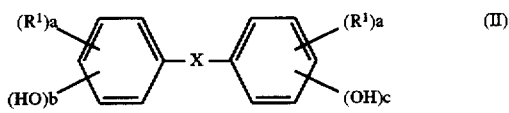

in which
X is a single bond, $SO_2$, S, O or CO,
R¹, a, b have the meaning specified above, and
c is 0, 2, or 3; or

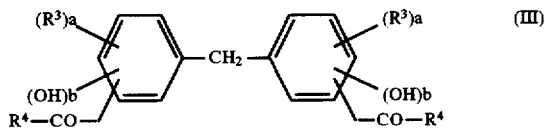

in which
R³ is a ($C_1$-$C_4$) alkyl group,
R⁴ is a hydrogen atom, a ($C_1$-$C_4$) alkyl or phenyl group, and
a, b have the meaning specified above.

2. A recording material as claimed in claim 1, wherein the phenolic additive has a hydroxyl group content of from about 7 to 19 mmol/g.

3. A recording material according to claim 1, wherein the radiation-sensitive 1,2-naphthoquinone-2-diazide comprises an ester of 1,2-naphthoquinone 2-diazide-4- or -5-sulfonic acid and a phenolic compound that contains at least 3 phenolic hydroxyl groups.

4. A recording material as claimed in claim 1, wherein the radiation-sensitive compound contains at least 1 mmol/g hydroxyl groups and at least 2 mmol/g diazo groups.

5. A recording material as claimed in claim 1, wherein the proportion of the phenolic compound is from about 1 to 20 percent by weight, based on the total weight of the nonvolatile components of the radiation-sensitive layer.

6. A recording material as claimed in claim 1, wherein the proportion of the phenolic compound is from about 2 to 10 percent by weight, based on the total weight of the nonvolatile components of the radiation-sensitive layer.

7. A recording material as claimed in claim 1, wherein the proportion of the radiation-sensitive compounds is from about 5 to 50 percent by weight, based on the total weight of the nonvolatile components of the radiation-sensitive layer.

8. A recording material as claimed in claim 1, wherein the proportion of the radiation-sensitive compounds is from about 10 to 30 percent by weight, based on the total weight of the nonvolatile components of the radiation-sensitive layer.

9. A recording material as claimed in claim 1, wherein the novolak binder has a hydroxyl group content of greater than or equal to about 7 mmol/g.

10. A recording material as claimed in claim 1, wherein the proportion of the novolak binder is from about 40 to 90 percent by weight, based on the total weight of the nonvolatile components of the radiation-sensitive layer.

11. A recording material as claimed in claim 1, wherein the proportion of the novolak binder is from about 60 to 85 percent by weight, based on the total weight of the nonvolatile components of the radiation-sensitive layer.

12. A recording material as claimed in claim 1, wherein the radiation-sensitive layer comprises an indicator dye.

13. A recording material as claimed in claim 12, wherein the indicator dye comprises a cationic triarylmethane or methine dye.

14. A recording material as claimed in claim 12, wherein the proportion of the dye is from about 0.1 to 5 percent by weight, based on the total weight of the nonvolatile components of the radiation-sensitive layer.

15. A recording material as claimed in claim 12, wherein the proportion of the dye is from about 0.5 to 3 percent by weight, based on the total weight of the nonvolatile components of the radiation-sensitive layer.

16. A recording material as claimed in claim 1, wherein the phenolic additive is a compound represented by formula I.

17. A recording material as claimed in claim 1, wherein the phenolic additive is a compound represented by formula III.

18. A recording material as claimed in claim 1, wherein the radiation-sensitive layer consists essentially of (B1), (B2) and (B3).

19. A recording material as claimed in claim 1, wherein the phenolic additive is a compound represented by formula II.

20. A positive-working recording material comprising:
(A) an aluminum base, and
(B) a mat-finished radiation-sensitive layer on said base that comprises, in admixture:
  (B1) a radiation-sensitive 1,2-naphthoquinone-2-diazide that is an ester of 1,2-naphthoquinone 2-diazide 4- or 5-sulfonic acid and a phenolic compound that contains at least 2 phenolic hydroxyl groups, which ester has a phenolic hydroxyl group content of at least about 0.5 mmol/g and a diazo unit content of at least about 1.5 mmol/g,
  (B2) a binder comprising a phenol/formaldehyde novolak which contains at least about 5 mmol/g phenolic hydroxyl groups, the phenol component of the binder comprising at least about 30 mol percent m-cresol and at least about 10 mol percent of at least one xylenol, the binder having a weight-average $M_w$ of about 2,000 to 12,000 and being insoluble in water but soluble or swellable in aqueous alkali, and
  (B3) at least one phenolic additive that has a molecular weight $M_w$ of not more than about 600 and that contains 2 to 4 uncondensed phenyl nuclei and at least about 6 mmol/g phenolic hydroxyl groups,
wherein the phenolic additive is a compound represented by one of the formulae I to III:

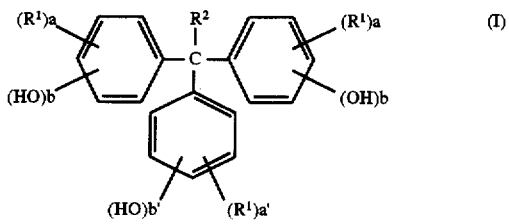

in which $R^1$ is a $(C_1-C_4)$ alkyl, methoxy or ethoxy group, $R_2$ is a hydrogen atom or a methyl group, a,a' are, independently of one another, 0, 1 or 2, and b,b' are, independently of one another, 1, 2 or 3;

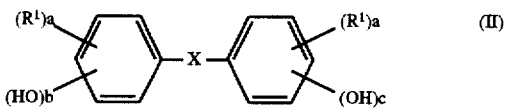

in which

X is a single bond, $SO_2$, S, O or CO, $R^1$, a, b have the meaning specified above, and c is 0, 2, or 3; or

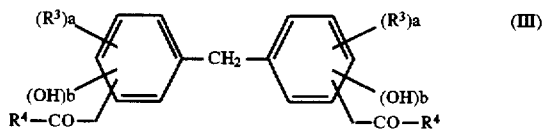

in which $R^3$ is a $(C_1-C_4)$ alkyl group, $R^4$ is a hydrogen atom, a $(C_1-C_4)$ alkyl or phenyl group, and a, b have the meaning specified above.

* * * * *

UNITED STATES PATENT AND TRADEMARK OFFICE
CERTIFICATE OF CORRECTION

PATENT NO. : 5,753,405
DATED : May 19, 1998
INVENTOR(S) : Andreas ELSAESSER et al.

It is certified that error appears in the above-identified patent and that said Letters Patent is hereby corrected as shown below:

Column 3, line 63, delete "(HO)$_b$", insert --(OH)$_b$--

Column 12, Claim 1, line 25, delete "(HO)$_b$", and insert --(OH)$_b$--.
Column 12, Claim 1, line 35, delete "CH$_2$", and insert --CH$^2$--.
Column 14, line 31, delete "(HO)$_b$" and insert --(OH)$_b$--.
Column 14, Claim 20, line 41, delete "CH$_2$", and insert --CH$^2$--.

Signed and Sealed this

Seventeenth Day of August, 1999

Attest:

Q. TODD DICKINSON

*Attesting Officer*   *Acting Commissioner of Patents and Trademarks*